(12) United States Patent
Roth et al.

(10) Patent No.: US 8,124,321 B2
(45) Date of Patent: Feb. 28, 2012

(54) ETCHING METHOD FOR USE IN DEEP-ULTRAVIOLET LITHOGRAPHY

(75) Inventors: Ronald Charles Roth, McKinney, TX (US); Georgina Marie Park, Dallas, TX (US); Rosemary Urmese Anthraper, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 656 days.

(21) Appl. No.: 12/185,197

(22) Filed: Aug. 4, 2008

(65) Prior Publication Data
US 2010/0028810 A1    Feb. 4, 2010

(51) Int. Cl.
G03F 7/28    (2006.01)

(52) U.S. Cl. .......... 430/311; 430/315; 430/394

(58) Field of Classification Search .......... 430/311, 430/328, 329
See application file for complete search history.

(56) References Cited

U.S. PATENT DOCUMENTS

| | | | |
|---|---|---|---|
| 6,117,622 A * | 9/2000 | Eisele et al. | 430/328 |
| 6,239,008 B1 * | 5/2001 | Yu et al. | 438/587 |
| 2004/0036076 A1 * | 2/2004 | Arita et al. | 257/79 |
| 2006/0050353 A1 * | 3/2006 | Huibers et al. | 359/238 |
| 2007/0003878 A1 * | 1/2007 | Paxton et al. | 430/311 |
| 2008/0180209 A1 * | 7/2008 | Ku et al. | 338/34 |

* cited by examiner

*Primary Examiner* — Kathleen Duda
*Assistant Examiner* — Caleen Sullivan
(74) *Attorney, Agent, or Firm* — Warren L. Franz; Wade J. Brady, III; Frederick J. Telecky, Jr.

(57) ABSTRACT

In a lithography process using an ultraviolet process, the applied ultraviolet resist can be removed by intentionally condensing the ultraviolet resist before removing the ultraviolet resist.

23 Claims, 9 Drawing Sheets

ETCHING METHOD FOR USE IN DEEP-ULTRAVIOLET LITHOGRAPHY

TECHNICAL FIELD OF THE DISCLOSURE

The technical field of this disclosure relates to the art of etching methods for use in fabricating microstructures or semiconductor devices, and more particularly to deep-ultraviolet lithographic methods in making microstructures.

BACKGROUND OF THE DISCLOSURE

As the demands for microstructures (e.g. micromirror devices) or semiconductor devices (e.g. integrated circuits) with increased performance and low cost increase, the drive for continual reduction in size of microstructures or semiconductor devices constantly increases. Reducing the size, or scale, of the components of a microstructure or a semiconductor device also requires being able to form and pattern components of microstructures on such reduced scales, consistently, robustly, and reproducibly, preferably in a self-aligned manner. In microstructure and semiconductor fabrications, etching steps are important from front-end processes to back-end processes, and are frequently key steps in combination with lithography steps. The scaling of microstructures or semiconductor devices can be limited by physical limits imposed by etching and the subsequent cleaning steps.

For example in making a micromirror device that often comprises a deformable hinge held above a substrate and a reflective mirror plate attached to the deformable hinge, a deep-ultraviolet (hereafter DUV) photolithography process is employed to define components (e.g. the deformable hinge) with critical dimensions. An element with a critical dimension is often referred to as an element has a desired characteristic dimension of sub-micron, such as 1 micron or less, or 0.5 micron or less. Because DUV photoresist, as well as the inorganic bottom anti-reflective coating (BARC) that is typically used in deep ultraviolet (DUV) photolithography, may not be removed through a typical clean process, such as a wet clean process for removing I-line photoresist that is widely used in fabricating microstructures, additional cleaning processes, such as ashing is performed to remove the DUV resist and BARC material. The additional cleaning process, however, may cause unwanted trenches or features, for example, in the spacer layer, which in turn affect the subsequent mirror plate. For demonstration purposes, FIG. 1a and FIG. 1b diagrammatically illustrate unwanted trenches caused by a DUV process in fabricating a deformable hinge of a micromirror device.

Referring to FIG. 1a, deformable hinge 102 of a micromirror device is formed on spacer layer 100 that comprises a sacrificial material. In forming the deformable hinge (102), a hinge layer comprised of a selected hinge material is deposited on spacer layer 100. A hinge mask layer that comprises dielectric layer 103, BARC layer 104, and DUV resist layer 106 is deposited on the hinge layer. In some examples, the hinge mask layer may not comprise a dielectric layer (e.g. dielectric layer 103), and instead, the BARC and DUV resist layers are directly deposited on the hinge layer (or the layer to be patterned). The hinge mask layer is then patterned so as to form a hinge mask with desired features/pattern. The patterned hinge mask layer is then used as the mask for forming (e.g. patterning) the desired features (e.g. the deformable hinge with a critical dimension) in the hinge layer (102).

After forming the features in the hinge layer, the dielectric layer (103), the BARC layer (104), and the DUV resist layer (106) need to be removed by etching. Wet-etching is now widely used for this purpose. However, some wet-etching processes are significantly less effective on BARC layers. Some other wet-etching processes, even though, are capable of removing both of the DUV resist and the BARC layers, but may cause negative impact to the functional members of the device. For example, a wet-etching process may also etch the spacer layer, the hinge layer formed on the spacer layer, and/or the layer below the spacer layer. An approach top this problem is to perform a wet-etching process followed by an ashing process.

During the ashing process, the DUV photoresist and the BARC material are removed. However, the ashing process also etches the exposed spacer layer (100) resulting in unwanted trenches 110 and 112, as well as undercut in the spacer layer (100), as diagrammatically illustrated in FIG. 1b. The unwanted trenches in the spacer layer can be translated to the subsequent process or processes, such as the process for making the mirror plate of the micromirror. As a consequence, the unwanted trenches resulted from the DUV process causes curvature in the mirror plate, which may yield degraded performance of the device or even device failure.

Therefore, what is desired is a method of etching process for use in DUV lithography in making microstructures or semiconductor devices.

SUMMARY

In one example, a method of making a microstructure device is provided, the method comprising: providing a substrate; depositing a first member layer on the substrate; patterning the first member layer to form a functional element of the device, comprising: forming the functional element from the first member layer through a deep-ultraviolet lithography process by using a selected deep-ultraviolet resist; and removing the deep-ultraviolet resist, comprising: condensing the ultraviolet resist by applying an ultraviolet radiation to the deep-ultraviolet resist; and removing the condensed ultraviolet resist.

In another example, a method for defining an element of a critical dimension in a microstructure is provided, the method comprising: depositing an element layer on a substrate, said element layer comprised of a selected material for the element to be defined; forming a mask on the element layer for defining the element in the element layer, wherein the mask comprises a deep-ultraviolet resist layer; patterning the element layer through a lithography process with the formed mask; and removing the mask, comprising: condensing the deep-ultraviolet resist such that a volume of the condensed deep-ultraviolet is reduced by 5% or more; and removing the condensed deep-ultraviolet resist by etching.

DETAILED DESCRIPTION OF SELECTED EXAMPLES

Disclosed herein is an etching method for use in microstructures and semiconductor devices. In combination with deep-ultraviolet (DUV) lithography, the etching process is capable of removing the DUV resist by intentionally condensing the DUV resist prior to etching.

Figure 1A:
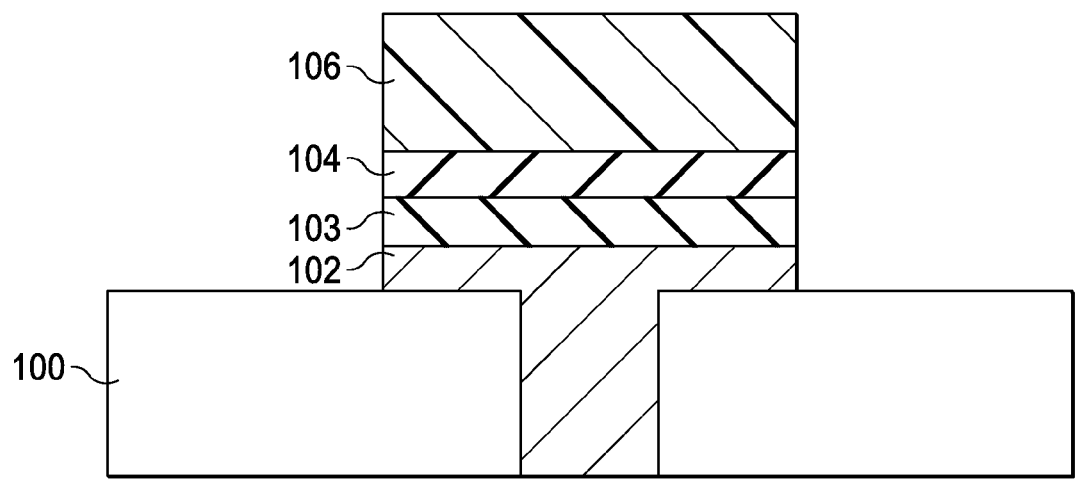
FIG. 1a and FIG. 1b diagrammatically illustrate a DUV lithography process performed in making a deformable hinge of a microstructure.
Figure 1B:
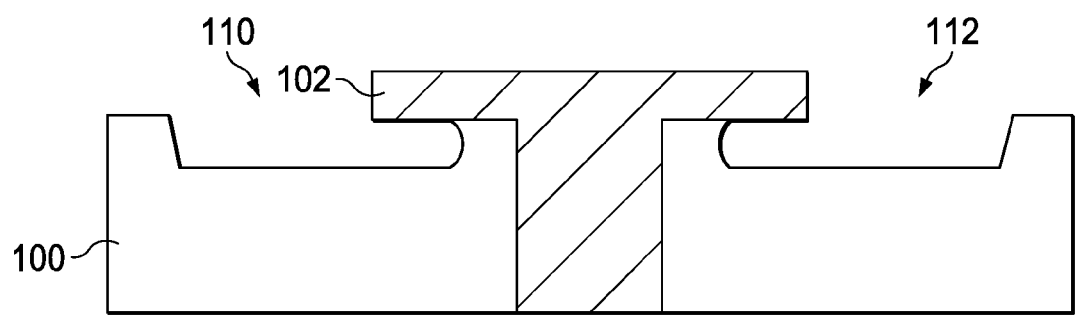
Figure 2A:
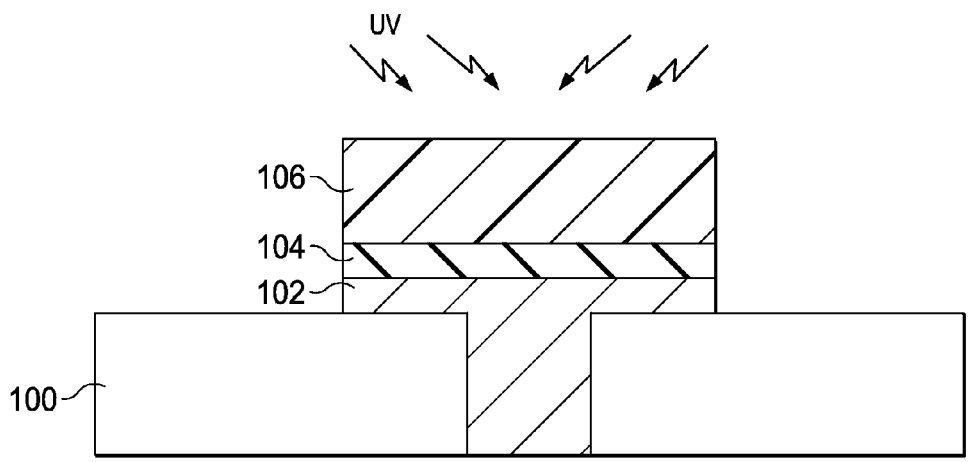
FIG. 2a through FIG. 2c diagrammatically illustrate an exemplary DUV photolithography process in making an element with a critical dimension of a microstructure.
Figure 2B:
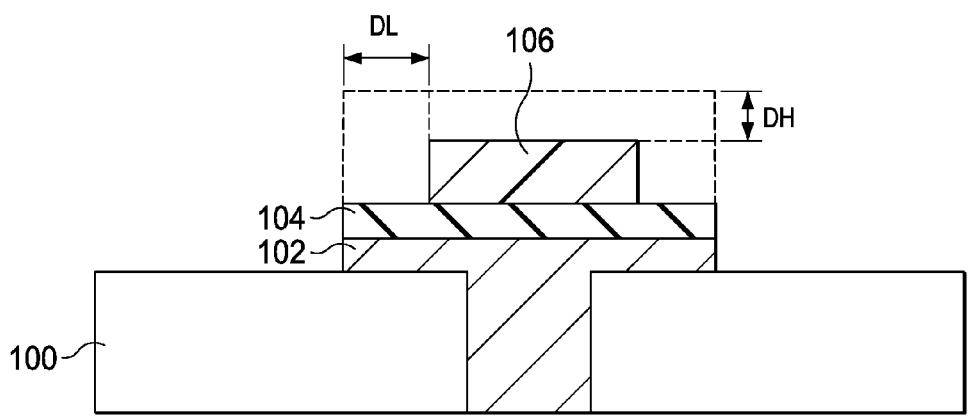
Figure 2C:
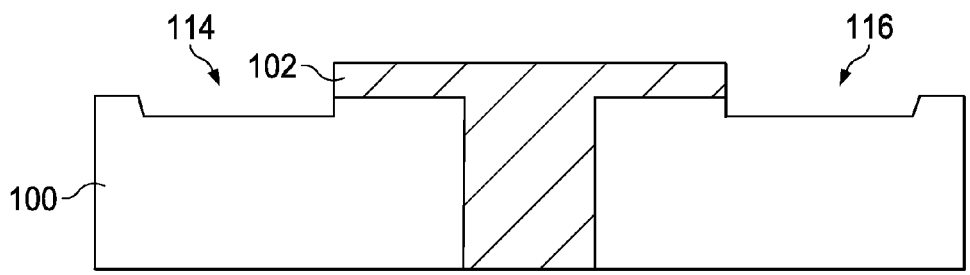

Referring to the drawings, FIG. 2a through FIG. 2c diagrammatically illustrate an exemplary DUV photolithography process in fabricating an element with a critical dimension of a microstructure. Referring to FIG. 2a, element 102 with a critical dimension of a microstructure is patterned on spacer layer 100 that comprises a sacrificial material. The element (102) is defined by using DUV photoresist 106 and BARC material 104. The DUV resist (106) can contain a resin, a photosensitive agent and a solvent and is specifically used in DUV lithography of 193 nm or 157 nm.

The BARC layer (104) if provided can be comprised of an organic or an inorganic material. The BARC material can be disposed using a standard thin film deposition technique, such as chemical deposition, chemical-physical deposition, physical deposition, or spin-coating.

In some examples, the BARC material (104) may not be used. As an alternative feature, a dielectric layer comprised of a selected dielectric material can be deposited on the element layer (102) and underneath the DUV layer (106).

In order to remove the DUV photoresist and the BARC material (104), an ashing process can be employed. As described above, the ashing process, however, may caused unwanted trenches or trenches with unwanted depths in spacer layer 100 when removing DUV photoresist 106 and BARC material 104. This problem can be solved by intentionally exposing the DUV photoresist (106) to UV light, such as UV light with a spectrum from 250 nm to 400 nm, and UV light of 193 nm or 157 nm. Of course, other UV light are also applicable. Under the UV radiation, the DUV photoresist is intentionally condensed, as diagrammatically illustrated in FIG. 2b.

Referring to FIG. 2b, the condensed DUV photoresist has lateral dimension reduction DL; and height reduction DH. The width of the DUV resist can also be reduced, which is not shown in the cross-sectional view. Depending upon the radiation condition, such as the radiation intensity, the temperature of the DUV photoresist, and the radiation time, any one of or any combinations of the lateral (length and width) and vertical (i.e. height) reduction DL and DH can be 50 angstroms or larger, such as 100 angstroms or larger, 150 angstroms or larger, 200 angstroms or larger, 500 angstroms or larger or 1000 angstroms or larger. Anyone of the dimensions (width, length, and height) can have a reduction of 0.5% or more, 1% or more, 1.5% or more, 2% or more, 3% or more, 5% or more, 10% or more, 20% or more or 30% or more. The volume reduction after the UV radiation can be 1% or more, 1.5% or more, 2% or more, 3% or more, 5% or more, 10% or more, 20% or more or 30% or more. In other words, the condensed DUV resist has a volume that is 99% or less, 98.5% or less, 98% or less, 95% or less, 90% or less, 80% or less, or 70% or less of the volume of the DUV resist before condensation.

The amount of reduction DH and DL may or may not be the same after a UV radiation treatment. The reduction rate (e.g. the amount of reduction per unit time) of the DH and DL may or may not be the same as well.

The UV radiation can be performed in many possible ways so as to accomplish different DUV photoresist-condensation results. For example, the UV light can be applied from the top of the DUV photoresist, or can be from a side of the DUV photoresist, or can be omni-directional, or can be along any desired direction toward the DUV photoresist. Multiple UV light beams can be deployed around the DUV photoresist to illuminate the DUV photoresist from different directions. In one example, a UV light beam of can be applied from the top of the DUV photoresist; and another UV light beam of a different intensity can be applied from a side of the DUV photoresist. As a consequence, the lateral and vertical size reduction/condensation of the DUV photoresist can be dynamically controlled.

It is noted that a thermal treatment, such as heating or baking can be performed during or after the UV radiation. The thermal treatment can be conducted by raising the temperature of the environment (e.g. the chamber) in which the DUV photoresist is located.

After the condensation of the DUV photoresist, a cleaning process using ashing can be performed so as to remove the DUV photoresist and the BARC material (if provided). It is found that the ashing process can be substantially constant for condensed DUV photoresist and non-condensed DUV photoresist, as shown in the diagrams of FIG. 3a and FIG. 3b.

Figure 3A:
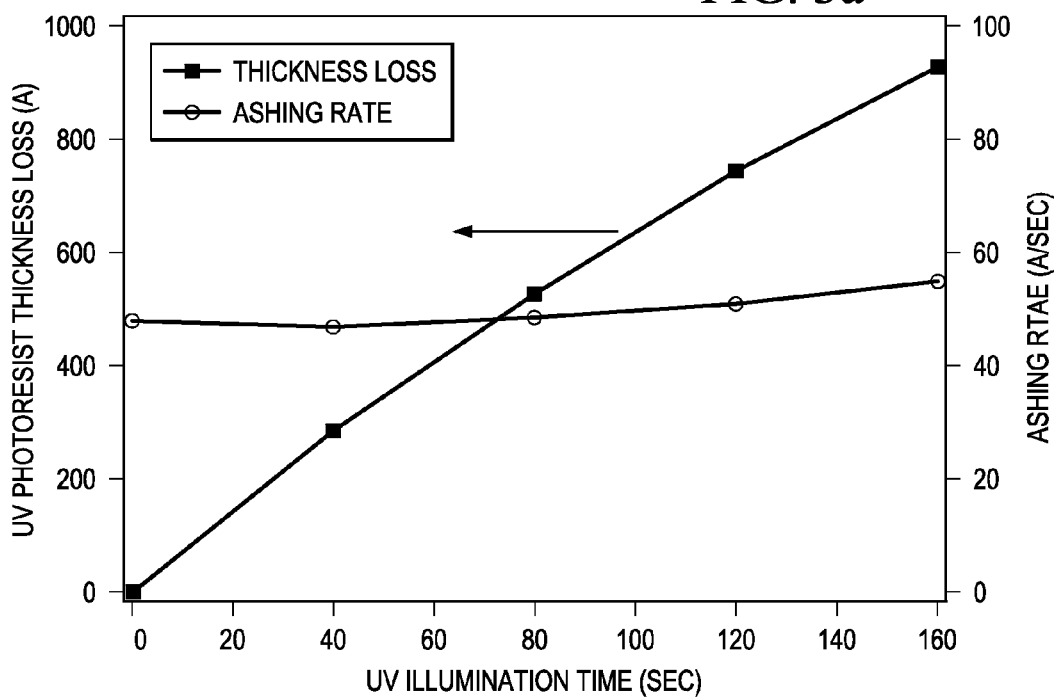
FIG. 3a is a diagram showing the resist thickness loss vs. the ash rate for a DUV photoresist.
Figure 3B:
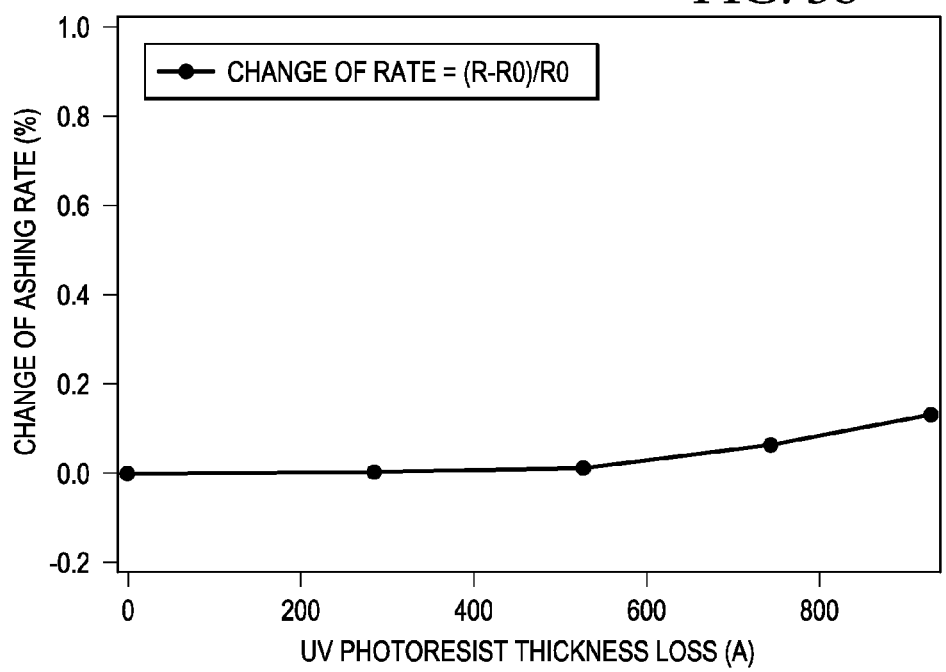
FIG. 3b is a diagram showing the changes of the ashing rate for different UV photoresist thickness losses.

Referring to FIG. 3a, the ashing rate and thickness loss (DH) are examined on a UV100 photoresist sample. The left-hand vertical axis plots the photoresist thickness loss in angstroms; and the right-hand vertical axis plots the ashing rate in angstrom-per-sec. The horizontal axis plots the UV light illumination time in seconds. The line with solid-squares shows the photoresist thickness losses; and the line with open circles shows the ashing rates.

It can be seen in FIG. 3a, the photoresist thickness loss is substantially linear to the UV illumination time. Specifically, the thickness of the DUV photoresist can be reduced by an amount from substantially zero to more than 900 angstroms with UV radiation for a time period from zero to 160 seconds. It will be appreciated by those skilled in the art that FIG. 3a is for demonstration purposes; and shows only the illumination time from zero to 160 seconds. Accordingly, the thickness loss of a particular DUV photoresist (UV100) is from substantially zero to more than 900 angstroms. With longer UV radiation periods, the DUV photoresist may have larger thickness losses. For example, the DUV photoresist may have a thickness loss of 1000 angstroms or more with UV radiation of more than 160 seconds. For other UV photoresist, the thickness loss may have other linear dependencies to the UV illumination time. In one example, the ultraviolet resist can be exposed for a time period of 20 seconds or more, 40 seconds or more, 60 seconds or more, 80 seconds or more, 100 seconds or more, 120 seconds or more, 140 seconds or more, 160 seconds or more, depending upon the dimension/volume of the ultraviolet resist and the condition of the UV light radiation (e.g. the intensity of the UV light and/or the temperature of the ultraviolet resist).

The ashing rate, as plotted in the right-hand vertical axis, is substantially constant for different thickness losses in the UV photoresist. Specifically, the difference between the ashing rate for the UV photoresist illuminated for 160 seconds and the ashing rate for the UV photoresist without UV illumination can be 30 angstroms-per-second or less, such as 20 angstroms-per-second or less, 10 angstroms-per-second or less, 5 angstroms-per-second or less, or 1 angstroms-per-second or less. The difference between the ashing rate for the UV photoresist reduced in vertical size by around 900 angstroms through UV illumination and the ashing rate for the UV photoresist without UV illumination or size reduction can be 30 angstroms-per-second or less, such as 20 angstroms-per-second or less, 10 angstroms-per-second or less, 5 angstroms-per-second or less, or 1 angstroms-per-second or less. The ashing rates for condensed through UV radiation and non-condensed UV photoresist can also be seen in FIG. 3b, wherein the percentage change of the ashing rate for different amounts of reduction is diagrammatically illustrated.

Referring to FIG. 3b, the vertical axis is the percentage change of the ashing rate that is defined as $(R_i - R_0)/R_0$, wherein $R_0$ is the ashing rate for the UV photoresist without UV radiation; and $R_i$ is the ashing rate for the UV photoresist with an amount of thickness loss. The horizontal axis plots the UV photoresist thickness loss as shown in FIG. 3b. It can be seen in FIG. 3b that the change of the ashing rate for UV photoresist having reduced thickness loss of around 900 angstroms is less than 15%. The change of the ashing rate for UV photoresist having reduced thickness loss of around 760 angstroms is less than 8%. The change of the ashing rate for UV photoresist having reduced thickness loss of around 525 angstroms is less than 2%. The change of the ashing rate for UV photoresist having reduced thickness loss of around 275 angstroms is less than 1%. In general, the change of the ashing rate for UV photoresist can be 30% or less, such as 20% or less, 15% or less, 10% or less, 5% or less, 2% or less, 1% or less, 0.5% or less, 0.1% or less.

It is noted that even though FIG. 3a and FIG. 3b show the UV photoresist thickness loss, it is also applicable to the horizontal losses. Specifically, the lateral dimension of the DUV photoresist can be reduced by an amount from substantially zero to more than 900 angstroms with UV radiation, for example, for a time period from zero to 160 seconds. The difference between the lateral ashing rate for the UV photoresist and the lateral ashing rate for the UV photoresist without UV illumination can be 30 angstroms-per-second or less, such as 20 angstroms-per-second or less, 10 angstroms-per-second or less, 5 angstroms-per-second or less, or 1 angstroms-per-second or less. The difference between the lateral ashing rate for the UV photoresist and the ashing rate for the UV photoresist without UV radiation or size reduction can be 30 angstroms-per-second or less, such as 20 angstroms-per-second or less, 10 angstroms-per-second or less, 5 angstroms-per-second or less, or 1 angstroms-per-second or less. The change of the lateral ashing rate for UV photoresist can be 30% or less, such as 20% or less, 15% or less, 10% or less, 5% or less, 2% or less, 1% or less, 0.5% or less, 0.1% or less.

After the cleaning by using an ashing process, the UV photoresist, as well as the BARC material (if provided) is removed, as diagrammatically illustrated in FIG. 2c. When the ashing time is short but sufficiently long to remove substantially all UV photoresist and the BARC material (if provided), unwanted trenches in spacer layer 100 resulted in typical DUV processes can be avoided or reduced, which ensures the quality of the subsequent structural elements, such as mirror plate. On another hand, trenches with controlled dimension (e.g. depths) can be benefit for subsequent processes or elements in some applications. For example, trenches with certain depths in the spacer layer (100) can be useful for obtaining flat mirror plate that is formed on the cleaned deformable hinge, as will be discussed afterwards with reference to FIG. 6a and FIG. 6b.

In examples wherein trenches in spacer layers are disfavored, the UV radiation time or the intensity for condensing the UV photoresist and the ashing time can be selected so as to minimize the unwanted trenches in the spacer layer. For example, the UV radiation time can be long enough and/or the radiation intensity can be high enough to maximize the condensation of the UV photoresist above the element with the critical dimension. As a consequence, the ashing time necessary for removing substantially all UV photoresist and the BARC material can be sufficiently short so as not to generate unwanted trenches in the spacer layer.

In examples wherein trenches with certain depths are desired, the UV radiation time, the radiation intensity, and the ashing time can be selected appropriately to obtain the desired trenches in the spacer layer. For example, for given radiation time and radiation intensity, the ashing time can be longer than necessary for removing the UV photoresist and the BARC material. In another example, for a specific ashing time, the radiation time can be shorter and/or the radiation intensity can be less than necessary for minimized trenches in the spacer layer.

The above described DUV lithographic process can be used for defining elements comprised of various materials. For example, the DUV lithographic process can be used for defining elements comprised of metal elements (e.g. Al, Ir, Ti, Ag, W, Ta and Mo), metal alloys (e.g. $WTi_x$, $WMo_x$, and $WTa_x$), metal compounds (e.g. $WAl_x$, $AlTi_x$) including metal silicides (e.g. $AlSi_x$, $WSi_x$, $MoSi_x$, $TiSi_x$, $ZrSi_x$, $CrSi_x$, $TaSi_x$, $AlSi_xCu_y$, and $TiW_xSi_y$) and metal nitrides, ceramic materials (e.g. silicon nitride, silicon carbide, polysilicon, titanium nitride, titanium oxide(s), titanium carbide, $CoSi_xN_y$, $TiSi_xN_y$, $TaSi_xN_y$, or other ternary and higher compounds), and other suitable materials.

The DUV material can be any suitable materials specifically for use in deep-ultraviolet lithography or ultraviolet lithography and the ultraviolet light used in the deep-ultraviolet lithography or the ultraviolet lithography can have various spectrums, such as a spectrum from 250 nm to 400 nm, or a spectrum of 193 nm or 157 nm. Of course, ultraviolet light with other spectrums are also applicable. For example, a deep Ultraviolet (DUV) resist can be polyhydroxystyrene-based polymers. The DUV material can be disposed using a standard thin film deposition technique, such as chemical deposition, chemical-physical deposition, physical deposition, or spin-coating.

The DUV lithography method as described above is applicable for making a wide range of microstructures or semiconductor deices. In particular, the above DUV method is also applicable for making noncritical dimension elements of microstructures and semiconductor devices. For demonstration purposes, FIG. 4 through FIG. 6b diagrammatically demonstrate an exemplary method of making a micromirror device, in which an exemplary DUV lithography process is implemented. It will be appreciated by those skilled in the art that the following discussion is for demonstration purposes, and should not be interpreted as a limitation. Other variations within the scope of this disclosure are also applicable.

Figure 4:
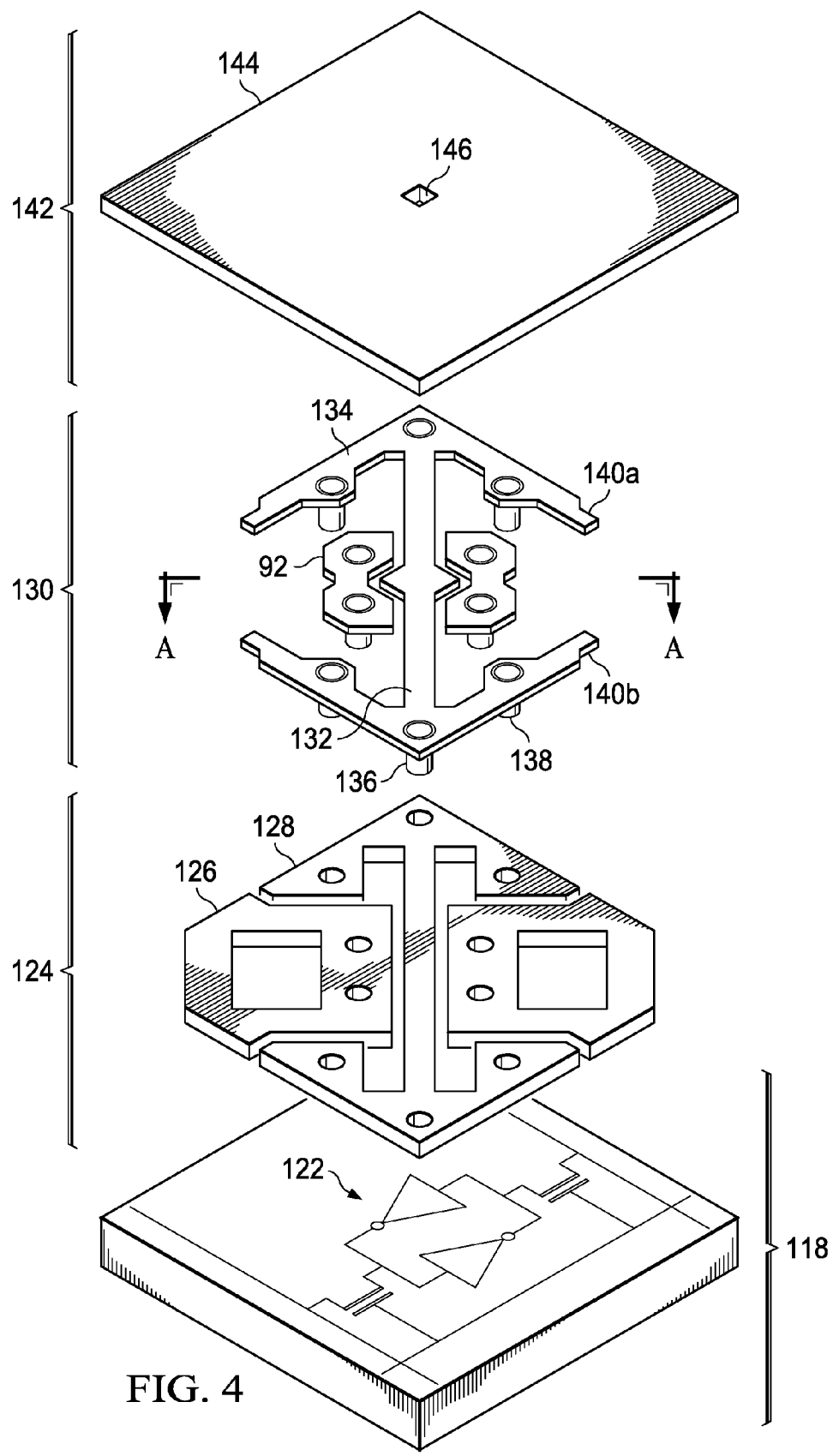
FIG. 4 diagrammatically illustrates an exemplary micromirror device that is fabricated by a method employing the DUV photolithography.

Referring to FIG. 4, the micromirror device comprises of a mirror plate portion (142) that further includes reflective mirror plate 144 and mirror post 146 provided for attaching the mirror plate to the deformable hinge (132) in hinge structure portion 130. Hinge structure portion 130 comprises deformable hinge 132, hinge arm 134, and posts (e.g. posts 136 and 138) that are provided for attaching the hinge structure portion (130) to the underneath electrode portion 124. The hinge structure portion (130) in this example has other features, such as elevated electrode 92 and landing tips 140a and 140b.

The elevated electrode (92) is for moving the mirror plate; and the landing tips are flexible beam structures in this particular example for limiting rotation of the mirror plate at desired rotational angles.

The electrode portion (124) has addressing electrodes, such as electrode 126 and a base (e.g. base 128) to which the above hinge structure portion can be attached.

The mirror plate portion (142), hinge structure portion (130), and electrode portion 124 are formed on substrate 118 having formed thereon electrical circuitry 122 for controlling the micromirror. A method for making the micromirror device employing an exemplary DUV lithographic process is diagrammatically illustrated in cross-sectional views in FIG. 5a through FIG. 6b; while the cross-sectional views are taken along line AA as illustrated in FIG. 4.

Figure 5A:
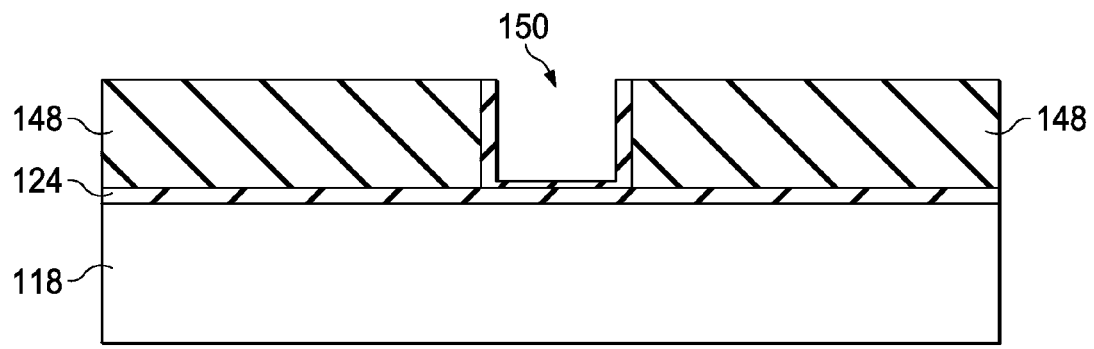
FIG. 5a through FIG. 5g diagrammatically illustrate an exemplary method of making the micromirror device in FIG. 4.

Referring to FIG. 5a, substrate 118 is provided and electrode portion 124 can be formed on the substrate using a method as set forth in U.S. Pat. No. 4,441,791 issued on Apr. 10, 1984 to Hornbeck, the subject matter of which is incorporated herein by reference in its entirety. Spacer layer 148 comprised of a sacrificial material, such as amorphous silicon or other suitable sacrificial materials, such as silicon nitride, siliconoxynitride, or a low-k material, is deposited on the substrate (118) and the electrode portion (124). The spacer layer 148 can be patterned so as to form posts, such as post 150, which can be followed by a step of filling the posts (e.g. 150) with a selected post material to improve the mechanical and/or electrical property of the post. In the example as illustrated in FIG. 5a, an electrically conductive post material is used to fill the post 150 formed in spacer layer 148; and the post material fills the sidewalls and the bottom portion of the post 150. The hinge portion (130 in FIG. 4) can be formed on the spacer layer (148), as diagrammatically illustrated in FIG. 5b.

Figure 5B:
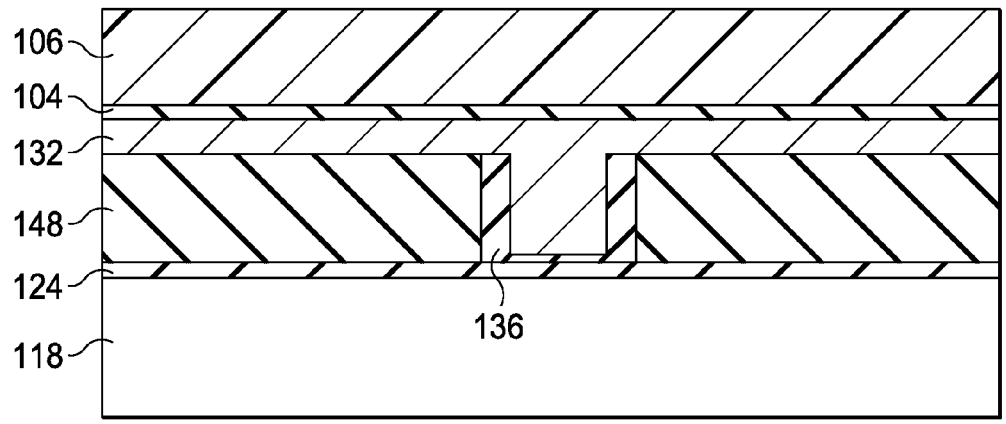

Referring to FIG. 5b, a hinge layer (132) comprised of a selected hinge material is deposited on the spacer layer. During the deposition, the hinge material can fill the post as illustrated in FIG. 5b. The BARC layer (104) and the DUV resist layer (106) can be deposited on the hinge layer (132). It is noted that a dielectric layer can be deposited between the BARC layer (104) and the hinge layer (132). For demonstration purposes it is assumed that the BARC layer and the DUV layer are directly deposited on the hinge layer without using a dielectric layer in the following discussion. The DUV resist layer 106 and the BARC layer 104 together form a hinge mask layer that is to be patterned to form a hinge mask for defining the desired features in the hinge portion, such as the deformable hinge (132), the hinge arm (e.g. hinge arm 134 in FIG. 4), and the raised electrodes (e.g. electrode 92 in FIG. 4). For simplicity and demonstration purposes, only the deformable hinge in the hinge portion is shown in FIG. 5a through FIG. 6b.

After deposition of the hinge mask layers (BARC layer 104 and DUV layer 106), the hinge mask layer are patterned by using a lithography process to form the desired hinge mask. The lithography can be performed through an energized or non-energized (e.g. spontaneous etching) with a selected etching agent or agents. In one example, a plasma etching is performed to etching the hinge mask layers. The etchant used in the plasma etching can comprise an interhalogen, a noble gas halide, or a fluorinated carbon or other chemical materials. The halogen can be F, Cl, Br or a combination thereof. When the halogen is fluorine (F), the halogen-containing gas may be $CF_4$, $C_4F_8$, $CH_3F$, $CHF_3$, $CF_2H_2$ or a combination thereof. When the halogen includes chlorine (Cl), the halogen-containing gas may be $Cl_2$, $BCl_3$, $CFCl_3$, $CF_2Cl_2$, $CF_3Cl$, or a combination thereof. When the halogen includes bromine (Br), the halogen-containing gas may be HBr, $CF_3Br$, $CF_2ClBr$, or a combination thereof. The etching gas may further include other gas, such as, $O_2$, $N_2$ or a combination thereof.

Figure 5C:
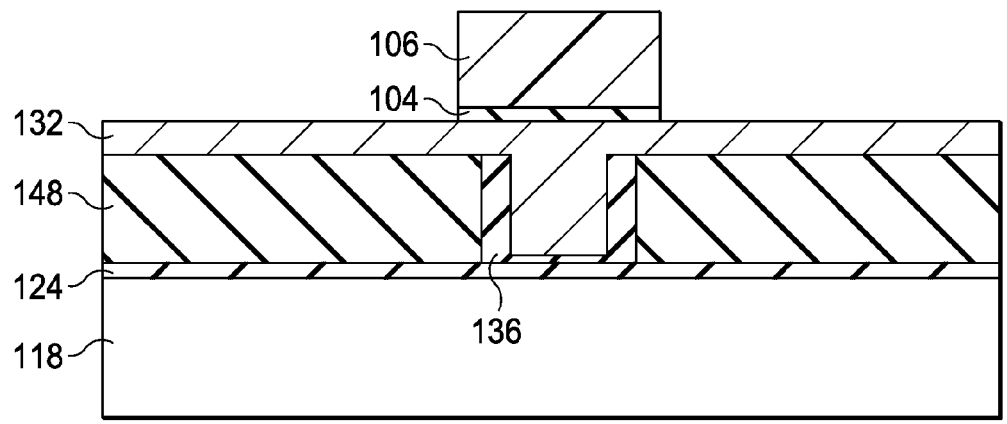
Figure 5D:
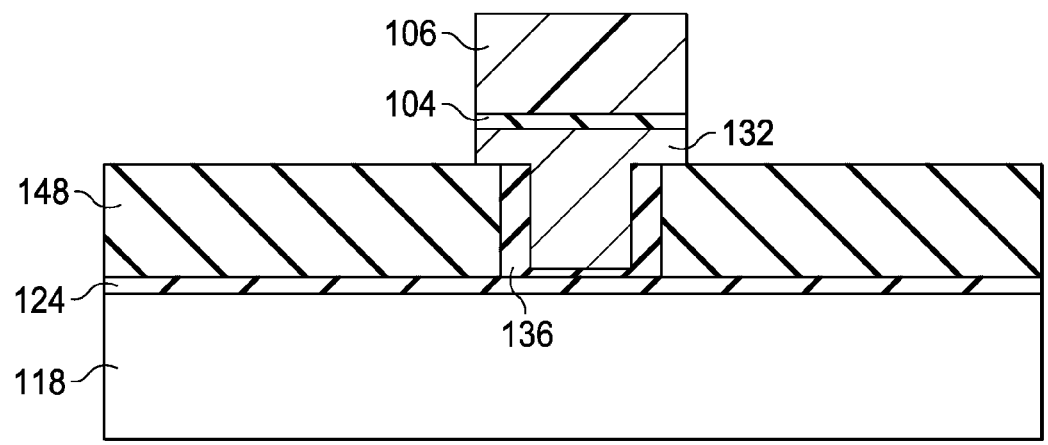

A portion of the formed hinge mask is diagrammatically illustrated in FIG. 5c. The hinge mask comprises patterned BARC layer 104 and the patterned DUV layer 106. The portion of the hinge mask has a geometry corresponding to the geometry of the desired deformable hinge. The hinge layer (132) can then be patterned so as to form the desired features, such as the deformable hinge, the hinge arm, and the raised electrodes. FIG. 5d diagrammatically illustrates the cross-section of the defined deformable hinge in the hinge layer.

The hinge mask layers (BARC layer 104 and DUV layer 106), as well as the remnants of the hinge material left by the hinge patterning, can be removed through a cleaning process. In one example, the cleaning process may comprise a wet-etching process and an ashing process. The wet-etching process is effective in removing remnants of the patterned hinge layer. It is noted that the wet-etching process can be effective on the DUV resist layer (106) or can be effective on both of the DUV and the BARC layers. It is preferred, though not required, that the wet-etching process does not cause impact on the spacer layer (e.g. spacer layer 148 in FIG. 5c) and/or the functional members of the device (e.g. the hinge layer or the layer below the hinge layer). In other examples, the wet-etching process can be a process such that the negative impact of the wet-etching process to the members of the device or the members used in fabricating the device (e.g. spacer layer 148) is minimized, such as within a tolerance threshold. An exemplary wet-etching process is an OH-based wet etching process. Due to the selectivity of the wet-etch to the DUV cured spacer layer 148, remnants of the patterned hinge layer can be removed and the spacer layer (148) is substantially not etched. An ashing process can be performed to remove the BARC layer (104), as well as the DUV resist layer (106). Given that an ashing process may cause unwanted trenches in the spacer layer or trenches with improper dimensions (e.g. depths), the DUV photoresist to be treated with UV radiation, as illustrated in FIG. 5e.

Figure 5E:
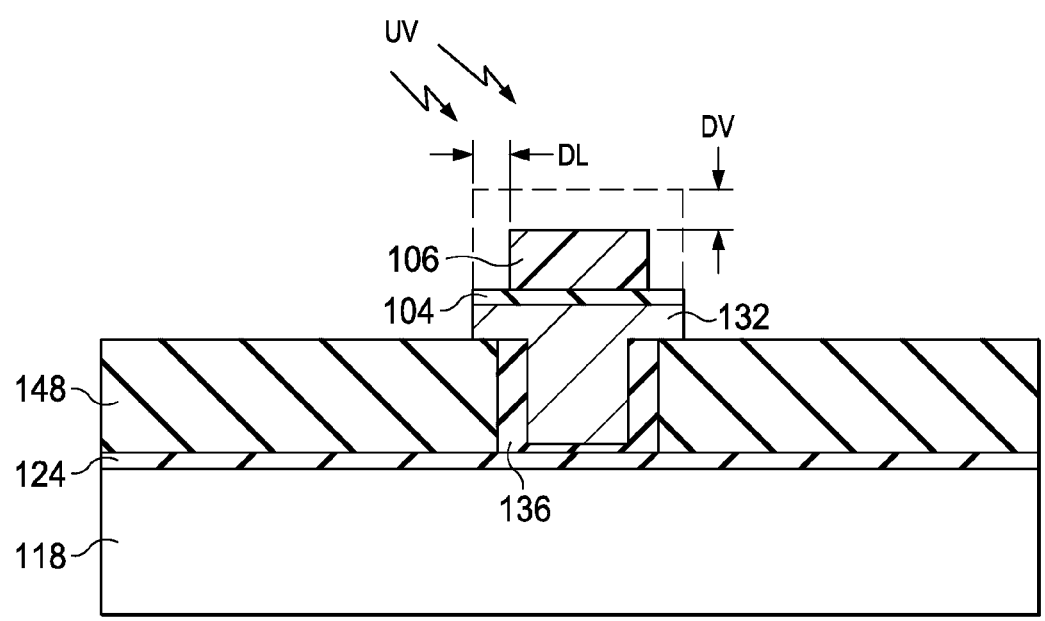

Referring to FIG. 5e, the DUV photoresist is reduced in size after the UV radiation as discussed above with reference to FIG. 2a and FIG. 2b. Because the ashing rate for condensed UV photoresist is substantially constant as compared to non-condensed UV photoresist, the ashing time necessary for removing the DUV photoresist and the BARC material can be significantly reduced such that the trenches in the spacer layer is avoided or the trenches in the spacer layer have tolerate dimensions (e.g. depths). After the UV radiation, an ashing process, such as an O-based ash, is performed to remove the DUV photoresist and the BARC material.

Figure 5F:
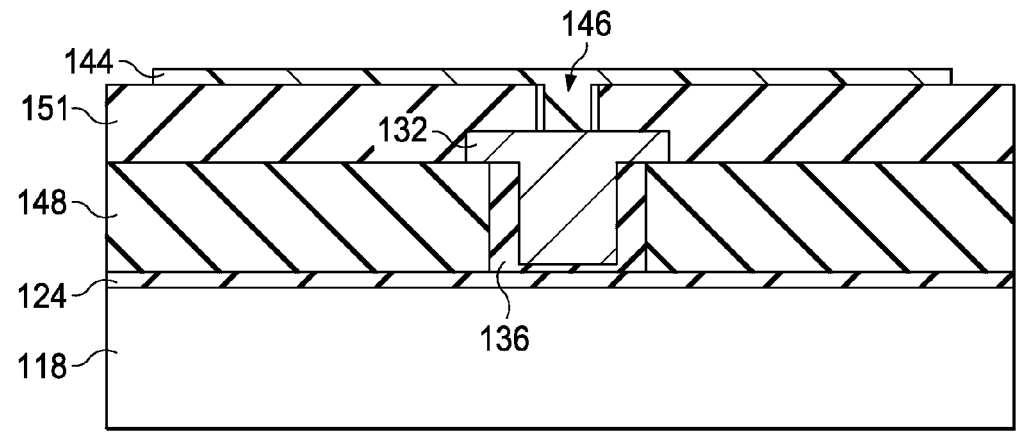

Reflective mirror plate 144 can then be formed as diagrammatically illustrated in FIG. 5f. Referring to FIG. 5f, sacrificial layer 151 is deposited on dielectric layer 148. Dielectric layer 151 is patterned to form mirror post 146. Mirror plate 144 can then be formed on dielectric layer 151 by for example, depositing a mirror plate layer followed by patterning the deposited mirror plate layer into mirror plate 144 with a desired shape. During the deposition of the mirror plate layer, the opening in the dielectric layer 151 can be filled so as to form the mirror post (146). In other examples, the mirror post can be filled with a selected post material to fill the post area formed in layer 151 before depositing the mirror plate layer.

Figure 5G:
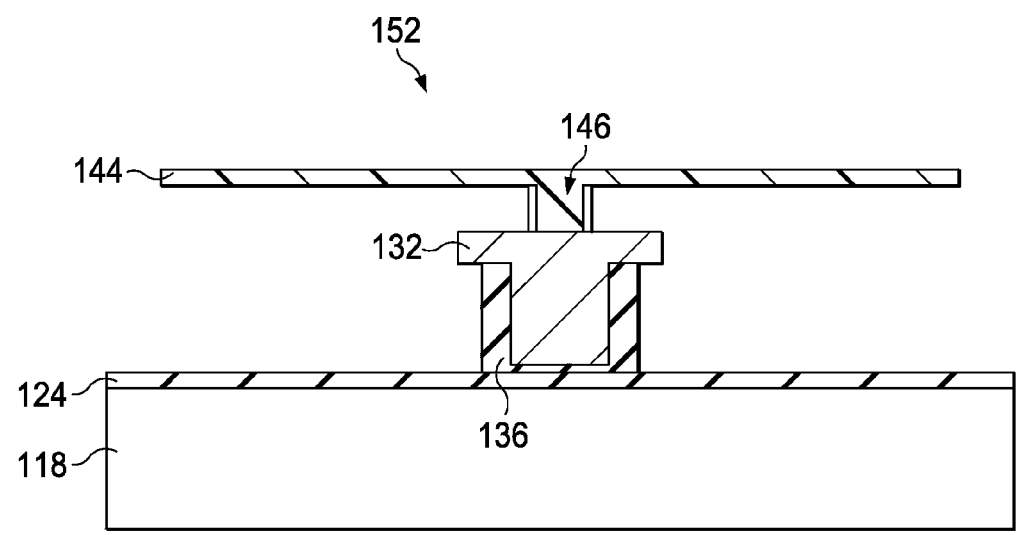

After forming all elements of the micromirror device, the sacrificial layers, such as sacrificial layers 148 and 151 can be removed by etching so as to release the deflectable and reflective mirror plate. FIG. 5g diagrammatically illustrates a cross-sectional view of the micromirror device after releasing.

In some examples, it may be desired to have a certain amount of trenches or fine features in the spacer layer. For example, certain amount of topography (e.g. periodic or non-periodic trenches) in the spacer layer (e.g. spacer layer 148 in FIG. 15d) may be helpful to improve the stiffness and/or rigidity of the mirror plate (e.g. mirror plate 144) after the mirror plate is released by removing the sacrificial layers (e.g. 148 and 151), as diagrammatically illustrated in FIG. 6a and FIG. 6b.

Figure 6A:
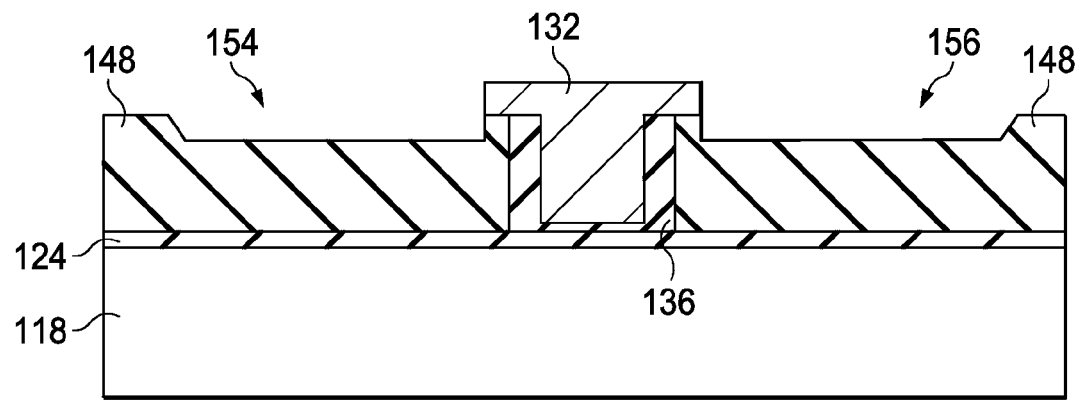
FIG. 6a and FIG. 6b diagrammatically illustrate another exemplary method of making the micromirror device in FIG. 4.
Figure 6B:
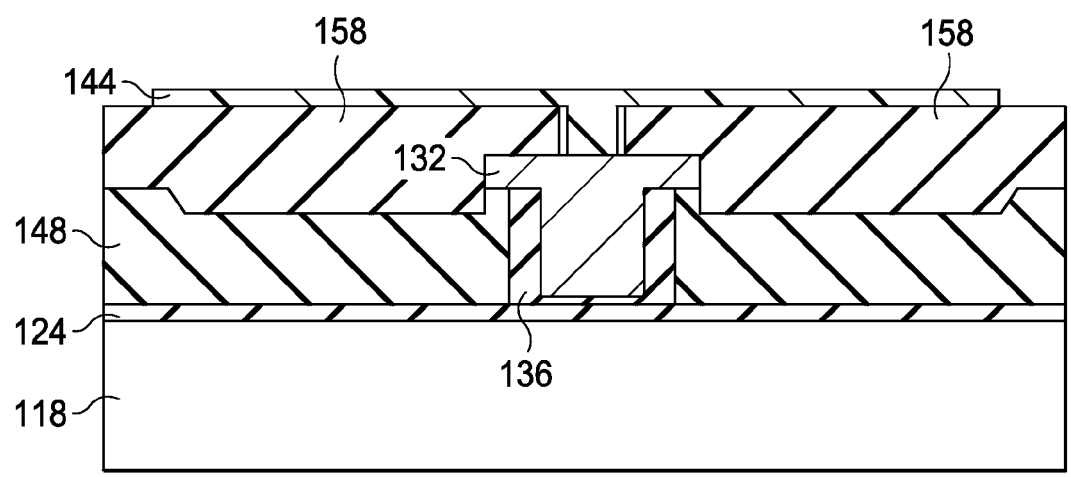

Referring to FIG. 6a, trenches 154 and 156 can be intentionally formed in sacrificial layer 148 (spacer layer) during the cleaning process for removing the DUV and the BARC material. The mirror plate (144) formed on sacrificial layer 158, as diagrammatically illustrated in FIG. 6b, may have a certain amount of curvature that is translated from or caused by the unevenness (e.g. trenches in layer 148). However, the rigidity and stiffness of the mirror plate (144) can be improved after releasing the mirror plate (144).

In microstructure fabrication, surfaces of microstructural elements are often desired to have planar surfaces. This can be accomplished by existing techniques, such as ashing or surface polishing (e.g. chemical-physical-polishing). Alternatively, planar surfaces can be obtained through an inverse-pattern-planarization process, as diagrammatically illustrated in FIG. 7a through FIG. 7c.

Figure 7A:
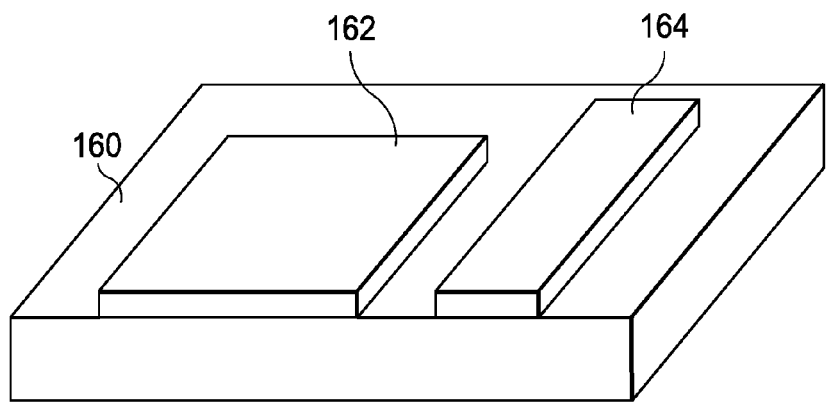
FIG. 7a through FIG. 7c diagrammatically illustrate an exemplary method inverse-patterning process that can be used in making microstructures.
Figure 7B:
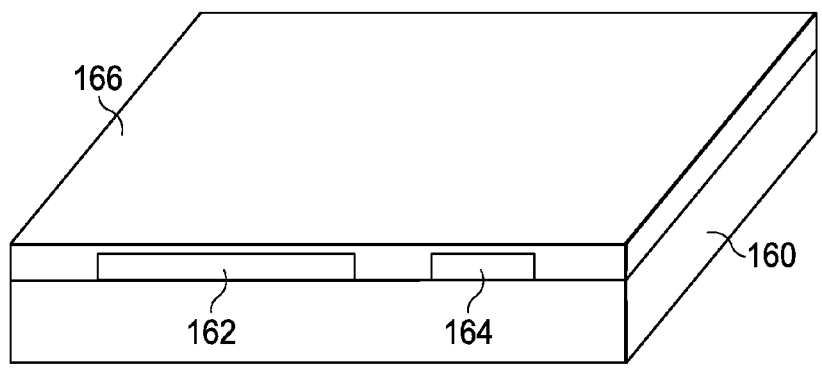
Figure 7C:
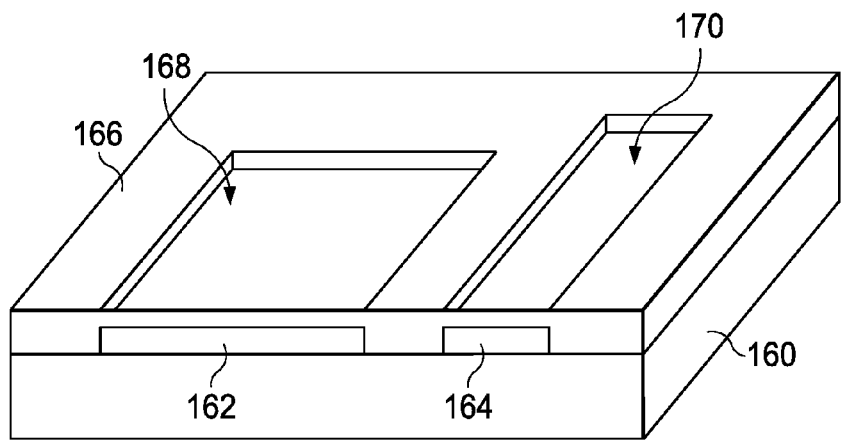

Referring to FIG. 7a, elements 162 and 164 are microstructural features formed on substrate 160. Sacrificial layer comprised of a selected sacrificial material, such as amorphous silicon is deposited on substrate 160 and elements 162 and 164, as diagrammatically illustrated in FIG. 7b. The sacrificial layer 166 is inversely patterned, as diagrammatically illustrated in FIG. 7c, such that the patterned sacrificial layer (166) is substantially inverse to the defined features (162 and 164). Specifically, patterned features 168 and 170 are created in sacrificial layer 166 after the inverse patterning of the sacrificial layer 166. The patterned dielectric layer (166) can then be thermally treated, such as by baking.

With the above method, the dielectric layer can fill in the unwanted trenches in substrate 160, wherein the trenches can be resulted from various causes, such as from the DUV process performed in defining the microstructural elements 162 and 164 and/or from the other non-DUV manufacturing processes. This method enables one to dial in exact volume needed to under-fill, exactly-fill, or over-fill the trenches by controlling the inverse planarizing resist (e.g. the sacrificial material in layer 166) volume through deposition, thickness, and bake time/temperature control. I-line photoresists have a unique property that enables this process to occur. If one breaks down the PAC (photoactive compound) in the layer, carboxylic acid products are formed that lower the glass transition temperature of the layer and permit it to flow and not cross-link.

It will be appreciated by those of skill in the art that a new and useful etching method for use in DUV lithography has been described herein. In view of the many possible embodiments, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. Therefore, the devices and methods as described herein contemplate all such embodiments as may come within the scope of the following claims and equivalents thereof.

We claim:

1. A method of making a microstructure device, comprising:
   providing a substrate;
   depositing a first member layer on the substrate;
   depositing a photoresist layer over the first member layer;
   patterning the photoresist layer using ultraviolet radiation;
   patterning the first member layer by etching the first member layer through the patterned photoresist layer to form a functional element of the device;
   after etching the first member layer, condensing the patterned photoresist layer using further ultraviolet radiation; and
   removing the condensed photoresist layer using an ashing process.

2. The method of claim 1, wherein the condensed photoresist has a volume that is 98% or less of the volume of the patterned photoresist before condensation.

3. The method of claim 1, wherein the condensed photoresist has a volume that is 90% or less of the volume of the patterned photoresist before condensation.

4. The method of claim 1, wherein the condensed photoresist has a height that is 100 angstroms or less than the height of the patterned photoresist before condensation.

5. The method of claim 1, wherein the condensed photoresist has a width that is 100 angstroms or less than the height of the patterned photoresist before condensation.

6. The method of claim 1, wherein the step of removing the condensed photoresist comprises ashing the condensed photoresist at an ashing rate that is substantially the same as an ashing rate for an uncondensed form of the same photoresist material.

7. The method of claim 1, wherein the step of removing the condensed photoresist comprises ashing the condensed photoresist material at a rate that is 15% or less than an etching rate for ashing an uncondensed form of the same photoresist material.

8. The method of claim 7, wherein the step of removing the condensed photoresist comprises ashing the condensed photoresist material at a rate that is 8% or less than an etching rate for ashing an uncondensed form of the same photoresist material.

9. The method of claim 8, wherein the step of removing the condensed photoresist comprises ashing the condensed photoresist material at a rate that is 5% or less than an etching rate for ashing an uncondensed form of the same photoresist material.

10. The method of claim 1, wherein the ashing process is an oxygen-based ashing process.

11. The method of claim 1, wherein the functional element has a critical dimension of 1 micron or less.

12. The method of claim 1, wherein removing the condensed photoresist layer includes also using a wet etching process.

13. The method of claim 1, further comprising forming another functional member of the device from a second member layer after removing the condensed ultraviolet resist.

14. The method of claim 1, wherein providing the substrate includes providing a first substrate; and depositing and patterning a first sacrificial layer on the first substrate; and wherein the first member layer is deposited on the first sacrificial layer.

15. The method of claim 14, wherein the first substrate is a silicon substrate having formed thereon an electrode and a circuit.

16. The method of claim 15, further comprising:
forming a hinge post on the patterned first sacrificial layer;
wherein the first member layer is a hinge layer; and the functional member is a deformable hinge;
depositing a second sacrificial layer on the patterned hinge layer after removing the condensed photoresist;
patterning the second sacrificial layer so as to form a mirror post;
forming a reflective and electrically conductive mirror plate on the second sacrificial layer; and
removing the first and second sacrificial layers.

17. A method for defining an element of a critical dimension in a microstructure, the method comprising:
depositing an element layer on a substrate, said element layer comprised of a selected material for the element to be defined;
forming a mask on the element layer for defining the element in the element layer, wherein the mask comprises a patterned ultraviolet resist layer;
patterning the element layer by etching through the formed mask; and
removing the formed mask after patterning the element layer, comprising:
condensing the patterned ultraviolet resist layer by treating with ultraviolet radiation following the etching, such that a volume of the patterned ultraviolet resist layer is reduced by 5% or more; and
removing the condensed ultraviolet resist layer by using an ashing process.

18. The method of claim 17, wherein the ashing process is an oxygen-based ashing process.

19. The method of claim 17, wherein the mask further comprises a dielectric layer disposed between the element layer and the ultraviolet resist layer; and wherein the step of removing the mask further comprises a step of removing the dielectric layer by a wet-etching process.

20. A method of making a micromirror device, comprising:
depositing a spacer layer over a substrate;
forming a hinge post with an opening in the spacer layer;
depositing a hinge layer over the spacer layer including within the hinge post opening;
depositing a hinge mask layer comprising a deep ultraviolet resist layer over the hinge layer;
forming a hinge mask comprising patterning the deep ultraviolet resist layer using a lithography process;
patterning the hinge layer to form hinge features using the patterned deep ultraviolet resist layer;
after patterning the hinge layer, reducing the size of the patterned deep ultraviolet resist layer by treating the patterned deep ultraviolet resist with ultraviolet radiation; and
after the treating with ultraviolet radiation, removing the reduced size patterned deep ultraviolet resist layer using an ashing process.

21. The method of claim 20, wherein the spacer layer is a first spacer layer; and further comprising:
after removing the reduced size patterned deep ultraviolet layer, depositing a second spacer layer over the first spacer layer including over the patterned hinge layer;
forming a mirror post with an opening in the second spacer layer;
depositing a mirror plate layer over the second spacer layer including within the mirror post opening;
patterning the mirror plate layer to form a mirror plate; and
after forming the mirror plate, removing the first and second spacer layers.

22. The method of claim 21, wherein the hinge mask layer includes an antireflective coating layer; and the deep ultraviolet release layer is deposited over the antireflective coating layer.

23. The method of claim 22, further comprising an electrode formed on the substrate; wherein the first spacer layer is deposited over the electrode.

* * * * *